(12) United States Patent
Liu et al.

(10) Patent No.: US 11,051,404 B2
(45) Date of Patent: Jun. 29, 2021

(54) METHOD FOR CONNECTING STACKED CIRCUITS BOARDS

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Rui-Wu Liu, Huaian (CN); Ming-Jaan Ho, New Taipei (TW); Man-Zhi Peng, Huaian (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 238 days.

(21) Appl. No.: 16/239,577

(22) Filed: Jan. 4, 2019

(65) Prior Publication Data

US 2020/0146149 A1    May 7, 2020

(30) Foreign Application Priority Data

Nov. 6, 2018 (CN) .......................... 201811315457.6

(51) Int. Cl.
| | |
|---|---|
| H05K 3/36 | (2006.01) |
| H05K 1/14 | (2006.01) |
| H05K 1/11 | (2006.01) |
| H05K 3/00 | (2006.01) |
| H05K 3/12 | (2006.01) |

(52) U.S. Cl.
CPC ............. *H05K 1/144* (2013.01); *H05K 1/111* (2013.01); *H05K 3/0026* (2013.01); *H05K 3/1258* (2013.01); *Y10T 29/49126* (2015.01)

(58) Field of Classification Search
CPC . F21V 15/01; H01R 13/2435; H01R 13/2492; H01R 2201/20; H01R 31/06; H01R 12/714; Y10T 29/49117; Y10T 29/49126; H05K 1/111; H05K 1/144; H05K 2201/10378; H05K 3/1258; H05K 7/1084
USPC .......... 29/830, 825, 829, 835, 846, 874, 884
See application file for complete search history.

(56) References Cited

U.S. PATENT DOCUMENTS

| | | | |
|---|---|---|---|
| 7,845,954 B2* | 12/2010 | Tomura | H05K 3/403 439/66 |
| 8,159,829 B2* | 4/2012 | Mori | H01R 13/6586 361/761 |

FOREIGN PATENT DOCUMENTS

| | | |
|---|---|---|
| CN | 1658439 A | 8/2005 |
| CN | 101513138 A | 8/2009 |

* cited by examiner

*Primary Examiner* — Thiem D Phan
(74) *Attorney, Agent, or Firm* — ScienBiziP, P.C.

(57) ABSTRACT

A method for connecting stacked circuit boards provides an insulation base as a hollowed annular plate and which has a first surface, a second surface, and a lateral surface. The insulating base defines stepped first grooves on the first surface, stepped second grooves on the second surface, and third grooves on the lateral surface. Insulating base is plated to deposit first pads in the first grooves, second pads in the second grooves, and wiring portions in the third grooves to connect first and second pads. Conductive ink layer is coated on first and second pads, and protective ink layer is coated on wiring portions and insulating base except for first and second pads. First and second circuit boards are provided for attachment to first and second pads respectively. A connecting structure is also provided.

10 Claims, 8 Drawing Sheets

METHOD FOR CONNECTING STACKED CIRCUITS BOARDS

FIELD

The subject matter herein generally relates to a connecting structure and a method for connecting stacked circuits boards by using the same.

BACKGROUND

In order to increase the surface-mounting area of the circuits boards to have sufficient number of the passive components, one circuit board is super-positioned on another circuit board via a connecting structure sandwiched there-between.

Traditionally, the connecting structure is a hollowed plate having a plurality of through holes which are drilled at the portion near the edge of the connecting structure, and the circuit boards are electrically connected through the metallization of the hole walls. However, such a connecting method requires complicated processes and process equipment, and the cost may be high as a result.

Therefore, there is room for improvement within the art.

BRIEF DESCRIPTION OF THE DRAWINGS

Implementations of the present technology will now be described, by way of embodiments, with reference to the attached figures.

DETAILED DESCRIPTION

Figure 1:
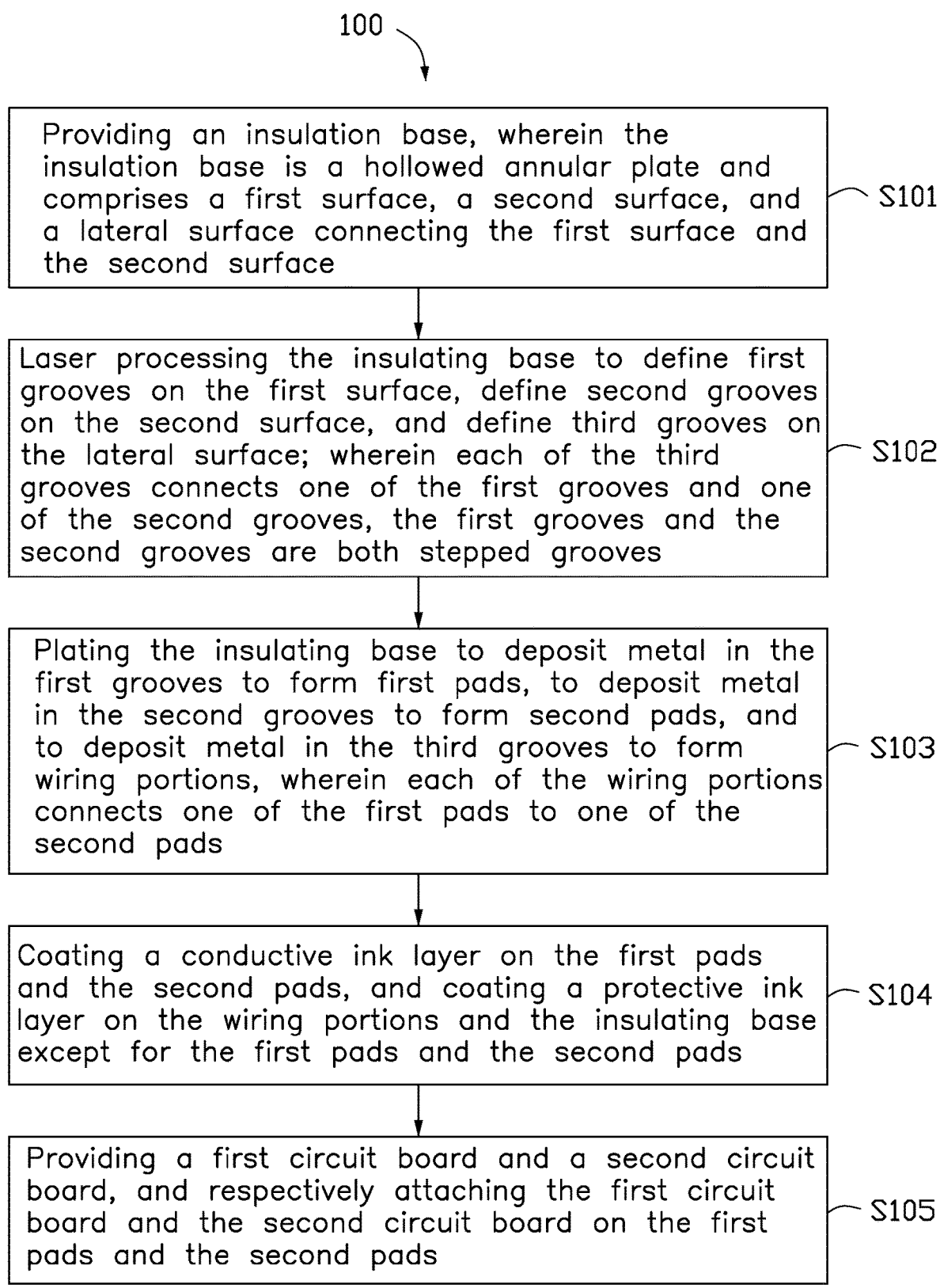
FIG. 1 is a flowchart of a method for connecting stacked circuit boards according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 shows a flowchart of a method for connecting stacked circuit boards 100 in accordance with an embodiment. The method is provided by way of embodiment, as there are a variety of ways to carry out the method 100. The method 100 described below can be carried out using the configurations shown in FIGS. 2-7, for example, and various elements of these figures are referenced in explaining the method 100. Each block shown in FIG. 1 represents one or more processes, methods, or subroutines, carried out in the method. Furthermore, the shown order of blocks is illustrative only and the order of the blocks can change. Additional blocks can be added or fewer blocks may be utilized, without departing from this disclosure. The example method can begin at block S101.

Figure 2:
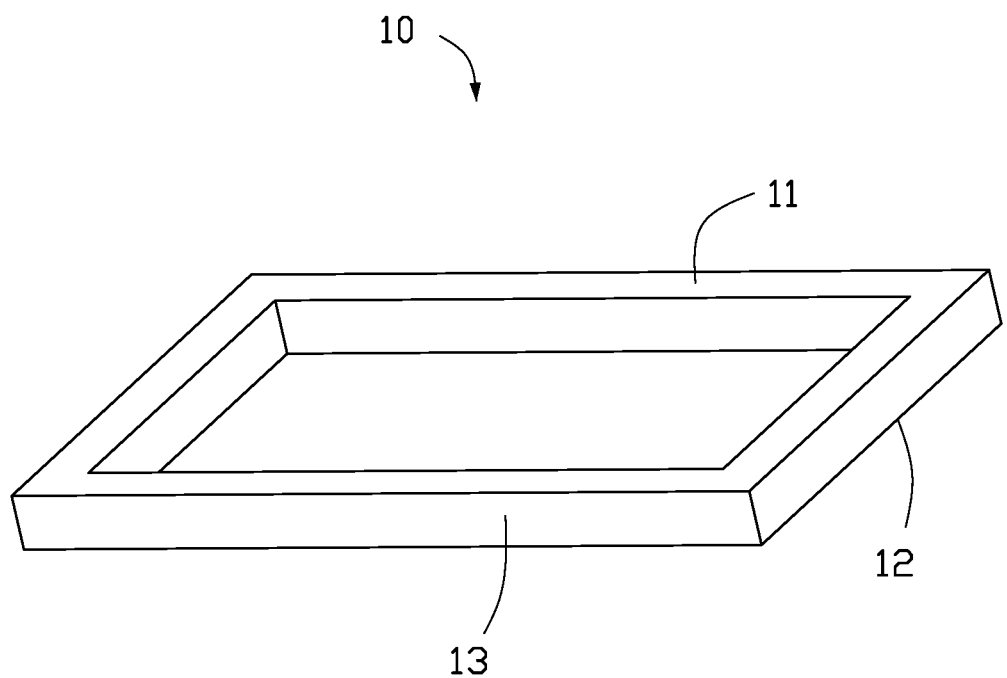
FIG. 2 shows an isometric view of an insulation base used in the method for connecting stacked circuit boards of FIG. 1.

At block S101, referring to FIG. 2, an insulation base 10 is provided. The insulation base 10 is a hollowed annular plate. The insulation base 10 includes a first surface 11, a second surface 12, and a lateral surface 13 connecting the first surface 11 and the second surface 12.

In an embodiment, the insulation base 10 is rectangular. A thickness of the insulating base 10 is about 1.6 mm.

Figure 3A:
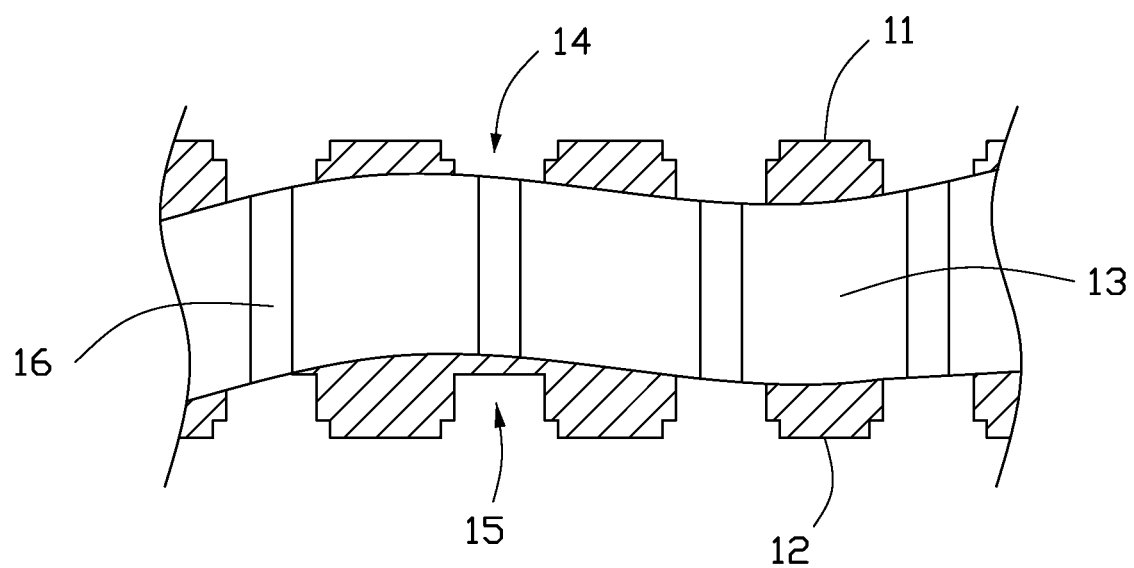
FIG. 3a and FIG. 3b respectively show a cross sectional view of part and a plan view of the insulation base in FIG. 2 after laser processing.
Figure 3B:
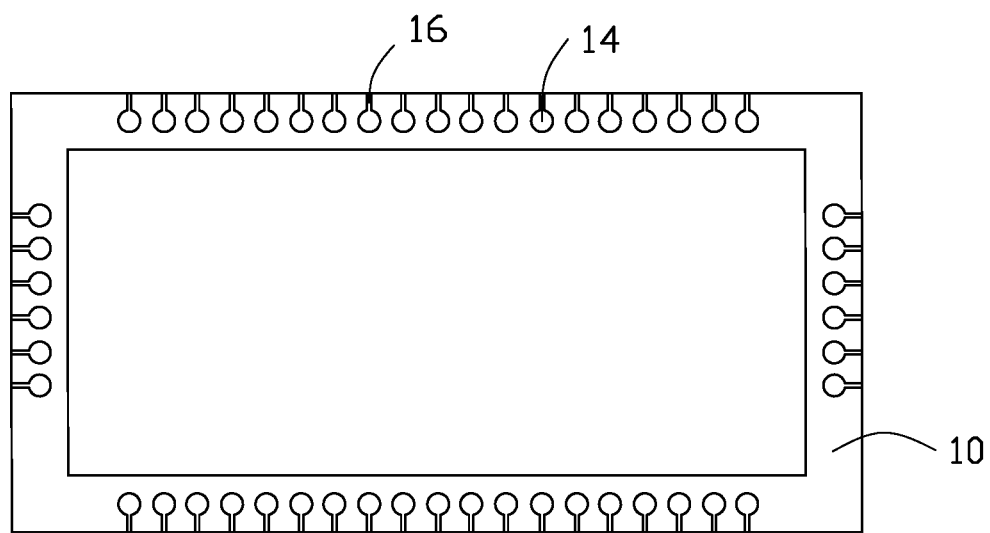

At block S102, as shown in FIG. 3a and FIG. 3b, the insulating base 10 is laser processed. First grooves 14 are defined on the first surface 11, second grooves 15 are defined on the second surface 12, and third grooves 16 are defined on the lateral surface 13. Each of the third grooves 16 connects one of the first grooves 14 and one of the second grooves 15, the first grooves 14 and the second grooves 15 are both stepped grooves.

Specifically, ends of each of the third grooves 16 extends to the first surface 11 and to the second surface 12 to provide communication between the first groove 14 and the second groove 15.

The first groove 14 and the second groove 15 have the same shape. A transverse cross-sectional shape of the first groove 14 and the second groove 15 may be hexagonal, circular (including an ellipse), rectangular, a cross shape, or a window shape, as shown in FIGS. 5a-5e. In an embodiment, a transverse cross-sectional shape of each of the first grooves 14 and the second grooves 15 is circular.

In the transverse cross-section, a diameter of each first groove 14 is decreased in a direction from the first surface 11 to the second surface 12, and a diameter of each second groove 15 is decreased in a direction from the second surface 12 to the first surface 11. A distance between adjacent first grooves 14 or adjacent second grooves 15 ranges from 0.35 mm to 0.50 mm.

Figure 4:
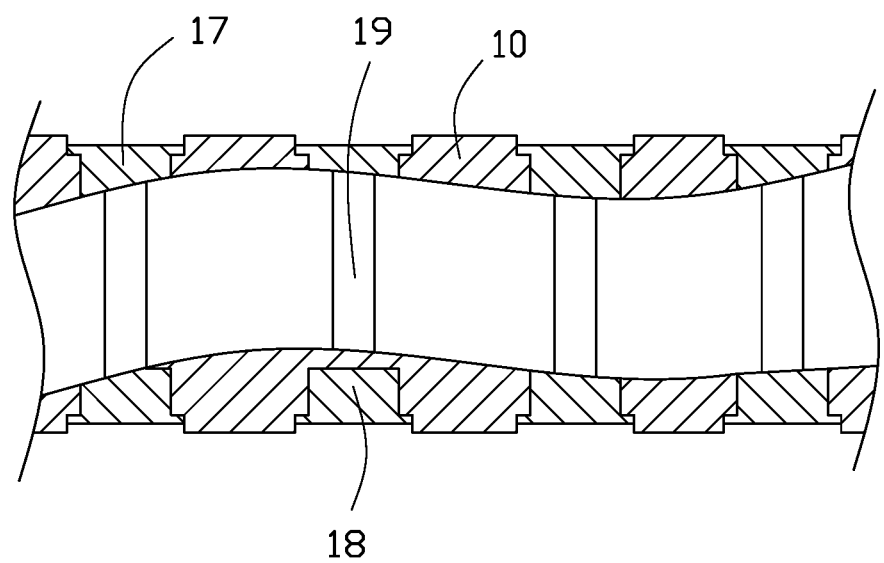
FIG. 4 shows a cross sectional view of part of the insulation base in FIG. 3a after being plated.
Figure 5A:
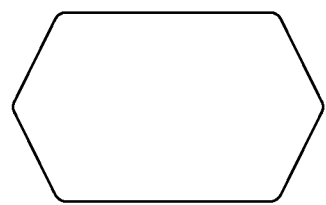
FIG. 5a to FIG. 5e show plan views of first and second pads in FIG. 4.
Figure 5B:
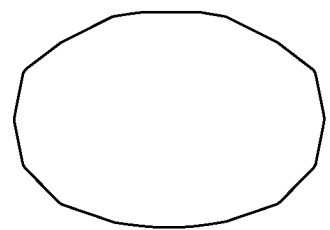
Figure 5C:
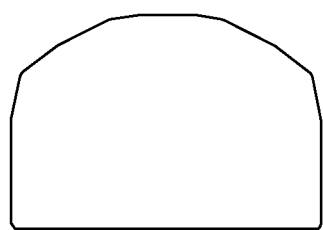
Figure 5D:
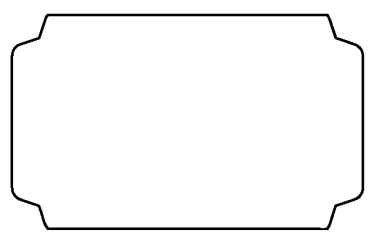
Figure 5E:
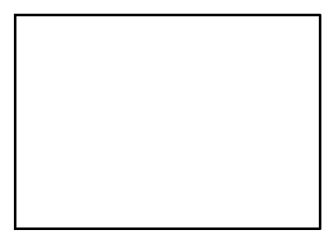

At block S103, as shown in FIG. 4, the insulating base 10 is plated. Metal is deposited in the first groove 14 to form first pads 17. Metal is deposited in the second grooves 15 to form second pads 18. Metal is deposited in the third grooves 16 to form wiring portions 19. Each of the wiring portions 19 connects one of the first pads 17 to one of the second pads 18.

A height of the first pad 17 and a height of the second pad 18 are less than or equal to the respective depths of the first groove 14 and the second groove 15. Preferably, the heights of the first pad 17 and the second pad 18 are less than the respective depths of the first groove 14 and the second groove 15 to facilitate subsequent brushing of pastes. The first pad 17 and the second pad 18 may be made of different metals or alloys which have different resistance values, such as silver and copper.

Figure 6:
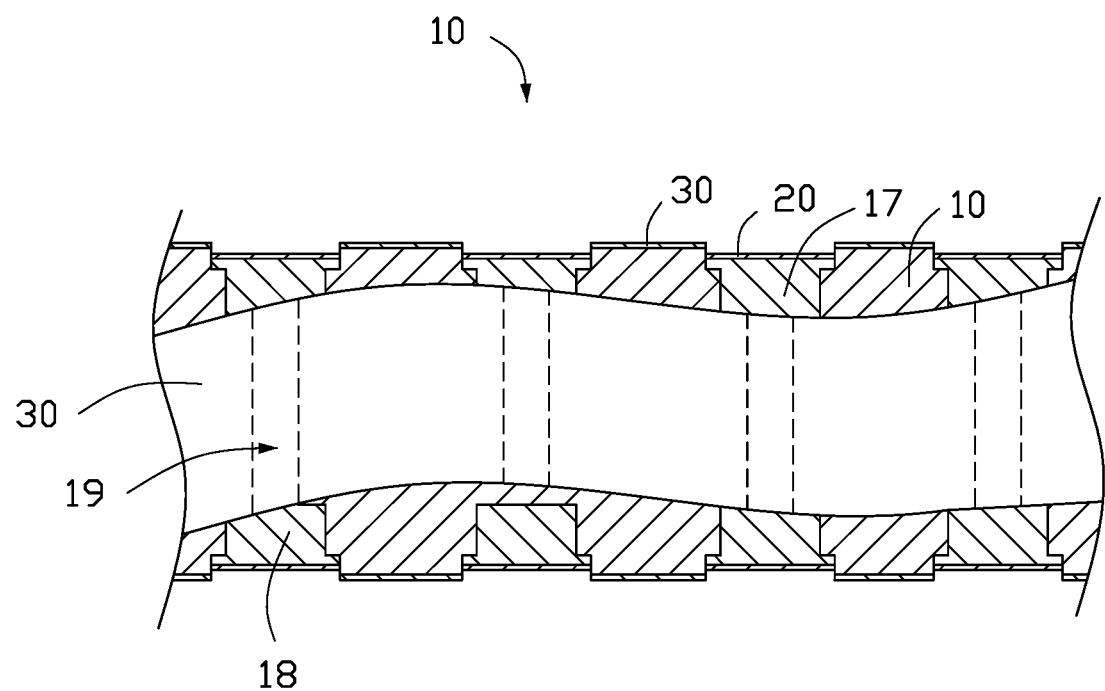
FIG. 6 shows a cross sectional view of part of a connecting structure according to an embodiment.

At block S104, as shown in FIG. 6, a conductive ink layer 20 is coated on the first pads 17 and the second pads 18, and a protective ink layer 30 is coated on the wiring portions 19 and the insulating base 10 except for the first pads 17 and the second pads 18. At this point, the connecting structure 70 is completed.

A thickness of the conductive ink layer 20 ranges from 5 μm to 10 μm. Because of the good adsorption force of the conductive ink layer 20, conductive inks are applied to the pad areas that need to be in contact with circuit boards, which improves the bonding force of the lines and also avoids line corrosion. At the same time, solder resist inks are applied to the insulating base 10 except for the pad areas, to protect the circuit.

Figure 7:
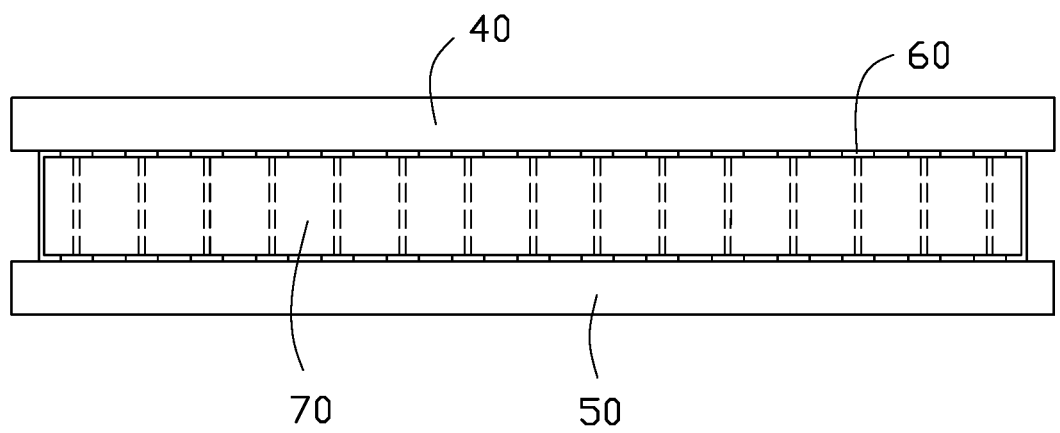
FIG. 7 shows a view of a side of the connecting structure in FIG. 6 for connecting the first circuit board and the second circuit board.

At block S105, as shown in FIG. 7, a first circuit board 40 and a second circuit board 50 are provided, and the first circuit board 40 and the second circuit board 50 are attached on the first pads 17 and the second pads 18 respectively.

Specifically, the connection between the first circuit board 40 and the first pads 17 (the second circuit board 50 and the second pads 18) may be made through a solder paste or an anisotropic conductive film. In an embodiment, before attaching the first circuit board 40 and the second circuit board 50, a solder paste layer 60 is printed on the conductive ink layer 20, the first circuit board 40 and the second circuit board 50 are connected to the first pads 17 and the second pads 18 by the solder paste layer 60.

The method as disclosed replaces drilling or electroplating process with a laser processing process to simplify the manufacturing process of the circuit board connection and reduce the cost. The first grooves 14 and the second grooves 15 are step-shaped, enhancing the bonding between the pads and the insulating base 10.

Referring to FIGS. 2-6, the connecting structure 70 of the embodiment includes an insulation base 10, a plurality of first pads 17, a plurality of second pads 18, a plurality of wiring portions 19, a conductive ink layer 20, and a protective ink layer 30. The first pads 17, the second pads 18, and the wiring portions 19 are formed on the insulation base 10. The conductive ink layer 20 is coated on the first pads 17 and the second pads 18. The protective ink layer 30 is coated on the wiring portions 19 and the insulating base 10 except for the first pads 17 and the second pads 18.

The insulation base 10 is a hollowed annular plate. The insulation base 10 includes a first surface 11, a second surface 12, and a lateral surface 13 connecting the first surface 11 and the second surface 12. In an embodiment, the insulation base 10 is rectangular. A thickness of the insulating base 10 is about 1.6 mm.

First grooves 14 are defined on the first surface 11, second grooves 15 are defined on the second surface 12, and third grooves 16 are defined on the lateral surface 13. Each of the third grooves 116 connects one of the first grooves 14 and one of the second grooves 15, the first grooves 14 and the second grooves 15 are both stepped grooves.

Specifically, each of the third grooves 16 extends to the first surface 11 and the second surface 12 to connect one of the first grooves 14 to one of the second grooves 15.

The first grooves 14 and the second grooves 15 have the same shape. A transverse cross-sectional shape of the first groove 14 and the second groove 15 may be hexagonal, circular (including an ellipse), rectangular, a cross shape, or a window shape, as shown in FIGS. 5a-5e. In an embodiment, a transverse cross-sectional shape of each of the first grooves 14 and the second grooves 15 is circular.

In the transverse cross-section, a diameter of each first groove 14 is decreased in a direction from the first surface 11 to the second surface 12, and a diameter of each second groove 15 is decreased in a direction from the second surface 12 to the first surface 11. A distance between adjacent first grooves 14 or adjacent second grooves 15 ranges from 0.35 mm to 0.50 mm.

The first pad 17 and the second pad 18 deposited in the first groove 14 and the second groove 15 are made of metal materials having different resistance values, such as silver and copper.

A height of the first pad 17 and a height of the second pad 18 are less than or equal to the respective depths of the first groove 14 and the second groove 15. Preferably, the heights of the first pad 17 and the second pad 18 are respectively less than the respective depths of the first groove 14 and the second groove 15 to facilitate subsequent brushing of pastes.

A thickness of the conductive ink layer 20 ranges from 5 μm to 10 μm. Because of the good adsorption force of the conductive ink layer 20, conductive inks are applied to the pad areas that need to be in contact with circuit boards, which improves the bonding force of the lines and also avoids line corrosion. At the same time, solder resist inks are applied to the insulating base 10 except for the pad areas, to protect the circuit.

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A method for connecting stacked circuit boards, comprising:

providing an insulation base, wherein the insulation base is a hollowed annular plate and comprises a first surface, a second surface, and a lateral surface connecting the first surface and the second surface;

laser processing the insulating base to define first grooves on the first surface, define second grooves on the second surface, and define third grooves on the lateral surface; wherein each of the third grooves connects one of the first grooves and one of the second grooves, the first grooves and the second grooves are both stepped grooves;

plating the insulating base to deposit metal in the first grooves to form first pads, to deposit metal in the second grooves to form second pads, and to deposit metal in the third grooves to form wiring portions, wherein each of the wiring portions connects one of the first pads to one of the second pads;

coating a conductive ink layer on the first pads and the second pads, and coating a protective ink layer on the wiring portions and the insulating base except for the first pads and the second pads; and providing a first circuit board and a second circuit board, and respectively attaching the first circuit board and the second circuit board on the first pads and the second pads.

2. The method for connecting stacked circuit boards of claim 1, wherein the first grooves and the second grooves have a same shape; a transverse cross-sectional shape of each of the first grooves and the second grooves is hexagonal, circular, rectangular, a cross shape, or a window shape.

3. The method for connecting stacked circuit boards of claim 1, wherein in the transverse cross-section, a diameter of each first groove is decreased in a direction from the first surface to the second surface, and a diameter of each second groove is decreased in a direction from the second surface to the first surface.

4. The method for connecting stacked circuit boards of claim 3, wherein a height of the first pad is less than or equal to a depth of the first groove, and a height of the second pad is less than or equal to a depth of the second groove.

5. The method for connecting stacked circuit boards of claim 1, wherein a distance between adjacent ones of the first grooves or adjacent ones of the second grooves ranges from 0.35 mm to 0.50 mm.

6. The method for connecting stacked circuit boards of claim 5, wherein a height of the first pad is less than or equal to a depth of the first groove, and a height of the second pad is less than or equal to a depth of the second groove.

7. The method for connecting stacked circuit boards of claim 1, wherein a height of the first pad is less than or equal to a depth of the first groove, and a height of the second pad is less than or equal to a depth of the second groove.

8. The method for connecting stacked circuit boards of claim 1, wherein the first pad and the second pad are made of silver and copper.

9. The method for connecting stacked circuit boards of claim 1, wherein a thickness of the conductive ink layer ranges from 5 µm to 10 µm.

10. The method for connecting stacked circuit boards of claim 1, wherein before attaching the first circuit board and the second circuit board, a solder paste layer is printed on the conductive ink layer, the first circuit board and the second circuit board are respectively connected to the first pads and the second pads by the solder paste layer.

* * * * *